United States Patent [19]

Hamuro et al.

[11] 4,453,633
[45] Jun. 12, 1984

[54] ELECTRONIC COMPONENT SERIES

[75] Inventors: Mitsuro Hamuro, Nagaokakyo; Fumihiko Kaneko, Takefu, both of Japan

[73] Assignee: Murata Manufacturing Co., Ltd., Japan

[21] Appl. No.: 441,642

[22] Filed: Nov. 15, 1982

[30] Foreign Application Priority Data

Nov. 19, 1981 [JP] Japan .............................. 56-186551

[51] Int. Cl.$^3$ ...................... B65D 73/04; B65D 85/42
[52] U.S. Cl. ..................................... 206/330; 206/331
[58] Field of Search ............... 206/330, 331, 328, 329

[56] References Cited

U.S. PATENT DOCUMENTS 2,766,510  10/1956  Heibel .................................. 206/330
4,223,786  9/1980  Hori .................................... 206/330

FOREIGN PATENT DOCUMENTS 774074  8/1957  United Kingdom ................ 206/330

Primary Examiner—Joseph Man-Fu Moy
Attorney, Agent, or Firm—Ostrolenk, Faber, Gerb & Soffen

[57] ABSTRACT

An electronic component series (11) for feeding electronic components to an automatic inserting machine comprising a carrier band (12), a plurality of the parallel lead type electronic components (13) arranged on and distributed longitudinally of the carrier band (12), and an adhesive tape (17) bonded to the carrier band (12) with the lead wires of the electronic components held therebetween, the lead wires (15, 16) being cut off adjacent the end edge of the adhesive tape associated with the extremities of the lead wires (15, 16), and the extremities being removed.

4 Claims, 8 Drawing Figures

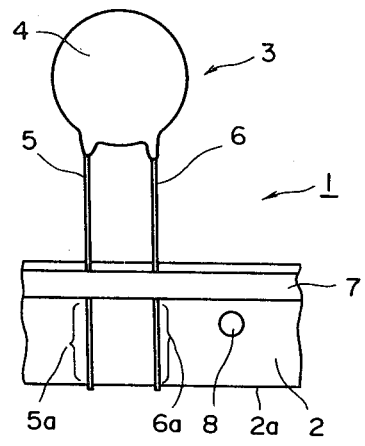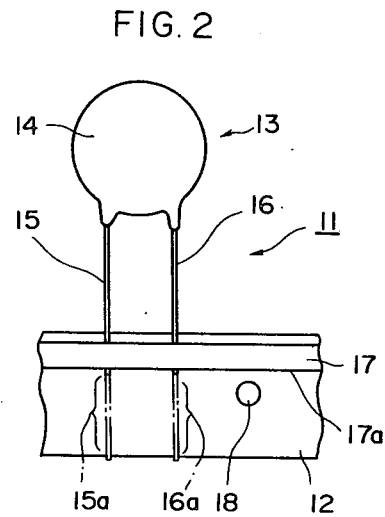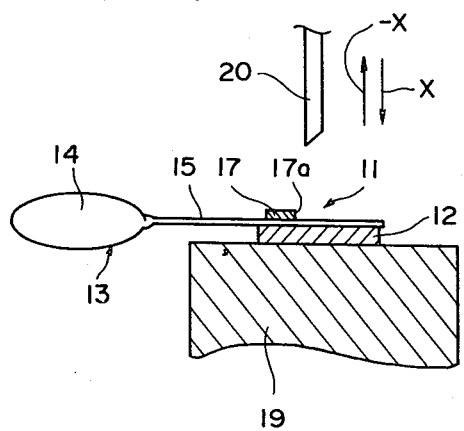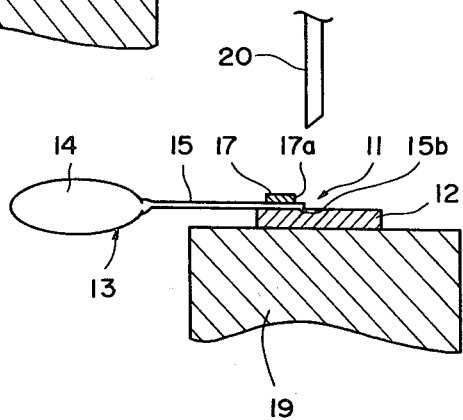

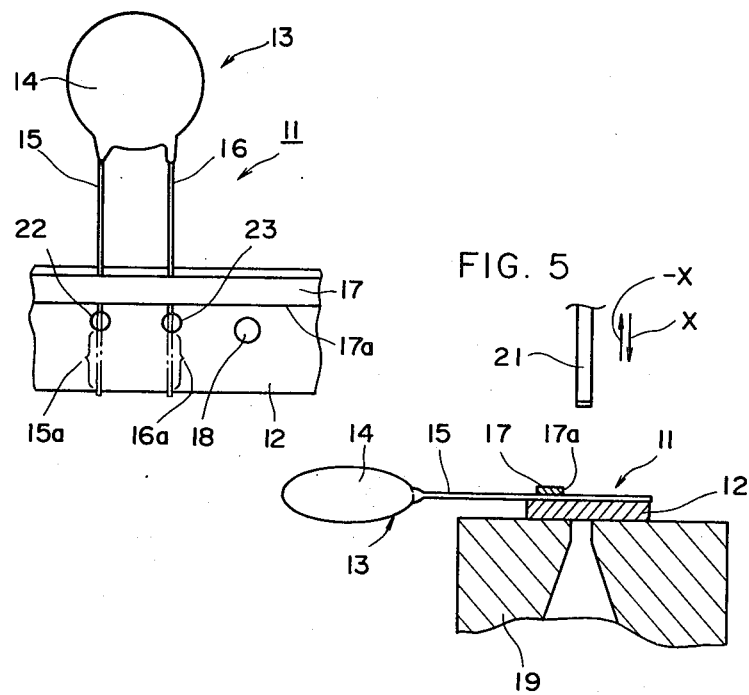
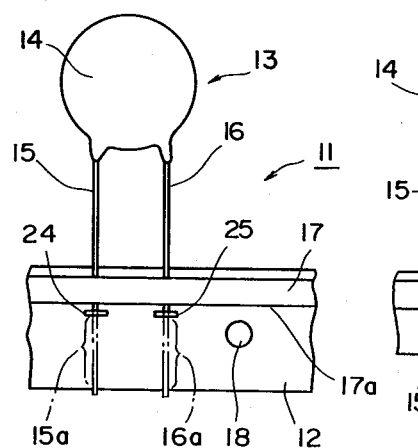

ELECTRONIC COMPONENT SERIES

BACKGROUND OF THE INVENTION

1. Field of the Invention

This invention relates to an electronic component series wherein electronic components of the so-called parallel lead type having a plurality of parallel extending lead wires are regularly arranged and held.

2. Description of the Prior Art

Electronic component series are mainly used to feed electronic components to an automatic inserting machine which automatically inserts electronic components into printed circuit boards. This invention relates to such an electronic component series for electronic components of the parallel lead type, but, as will be later described, it can be advantageously utilized in the process of production of electronic components of the parallel lead type.

In supplying electronic components to an automatic inserting machine, it is necessary to feed them into the automatic inserting machine in a suitable attitude to ensure that they are correctly inserted into the print circuit boards. Thus, an electronic component series generally includes a carrier band and electronic components held by the carrier band, the electronic components being held and regularly arranged on the carrier band by retainer means such as an adhesive tape. An electronic component of the parallel lead type comprises an electronic component element and lead wires and such components are produced in the same manner as that for electronic component series in some cases. In other cases, they are produced in a different manner. That is, a plurality of lead wires are arranged side by side on a carrier band and then electronic component elements are fixed thereto as by solder dip, whereby electronic components are produced in large quantities at a time. The electronic components thus produced are removed from the carrier bands used for production and are then held on carrier bands for electronic component series and shipped.

FIG. 1 is a fragmentary plan view showing a portion of a conventional electronic component series as described above. As shown therein, a plurality of electronic components 3 (in FIG. 1, only one is shown) are arranged on and distributed longitudinally of a carrier band 2 made, e.g., of thick paper. Each electronic component 3 comprises an electronic component element 4, and lead wires 5, 6 parallelly led out of the electronic component element 4. An adhesive tape 7 is applied to the carrier band 2 in a region closer to the end edge 2b of the carrier band. This adhesive tape 7 fixes the electronic components 3 in such an attitude that they can be accurately positioned for insertion into an automatic inserting machine. Holes 8 are formed in the carrier band 2 between the adhesive tape 7 and the end edge 2a of the carrier band opposite to the side associated with the electronic component elements 4. The holes 8 engage a sprocket (not shown) for feeding the electronic component series shown in FIG. 1 in the direction of its length and are formed to ensure that the components 4 are accurately positioned onto printed circuit boards in the automatic inserting machine. In the electronic component series of FIG. 1 constructed in the manner described above, since the adhesive tape 7 is not in contact with the holes 8, there is no possibility that the adhesive agent on the adhesive tape will seep into the holes 8, and there is no possibility that the adhesive agent will stick to the sprocket (not shown) of the feed mechanism which engages the holes 8. The presents problems which might detract from the accuracy with which the components 4 are positioned in the automatic inserting machine, and therefore the present electronic component series is practically advantageous.

Now, as described above, the positioning and fixing of the electronic components 3 on the carrier band 2 is effected by the adhesive tape 7 which bonds and fixes the electronic components 3 to the carrier band 2 with portions of the lead wires 5 and 6 held therebetween. Therefore, only the portions of the lead wires 5 and 6 contacted by the adhesive tape 7 function to properly position the electronic components 3 on the band 2. As such, the extensions 5a and 6a of the lead wires 5 and 6 extending in the direction away from the electronic component elements 4 do not aid in the positioning of the electronic components 3. To the contrary, they can be a hinderance since they can be bent or entangled through physical contact during transfer of the electronic component series 1, with the result that not only is such transfer impeded but also the attitude of the electronic components 3 properly positioned on the carrier band 2 is shifted to an undesirable one or sometimes the adhesive tape 7 is peeled from the carrier band 2. Further, during use in the automatic inserting machine, the lead wires 5 and 6 are severed between the electronic component elements 4 and the adhesive tape 7. Thus, the extensions 5a and 6a cannot be utilized even in the final electronic components 3 and have been discarded after the electronic components 3 are fixed to print circuit boards. If, therefore, the extensions 5a and 6a of the lead wires 5 and 6 can be eliminated, this is extremely desirable from the standpoint of not only cost reduction but also the saving of materials.

However, as previously described, in shipping the electronic components, measurements of their characteristics are made prior to their shipment for the purpose of quality control. Measurements of characteristics are made at the extensions 5a and 6a. That is, in order that measurements of the characteristics of the electronic components 3 held in the electronic component series 3 may be made in an automatic process, the extensions 5a and 6a, which are free portions of the lead wires 5 and 6, are necessary. Further, in order that the positioning of the lead wires 5 and 6 may be satisfactorily effected in taping the electronic components 3, it has been necessary for the lead wires 5 and 6 to have extensions 5a and 6a of fixed length. Thus, the conventional electronic series 1 is provided with lead wires 5 and 6 extended to the extensions 5a and 6a, in spite of the fact that there are many problems as described above.

SUMMARY OF THE INVENTION

Accordingly, a principal object of this invention is to provide an inexpensive electronic component series which eliminates the problems described above and which is capable of allowing easy measurements of characteristic and securing an attitude for accurate positioning.

The foregoing and other objects of the present invention are achieved by providing an electronic component series comprising:

an elongated, flexible carrier band having a top and a bottom edge;

a plurality of electronic components of the parallel lead type each having lead wires and an electronic element connected to said lead wires, said electronic component being arranged on and distributed longitudinally of said carrier band with said electronic component extending above said top edge of said carrier band and said lead wires overlapping a portion of said carrier band; and an elongated adhesive tape having a transverse width which is less than the transverse width of said carrier band, said tape being bonded to said carrier band with said lead wires of said electronic components held therebetween in a region closer to said top edge of said carrier band than said bottom edge of said carrier band;

each of said wires having an end portion which terminates at a location substantially immediately adjacent that end of said adhesive tape which is closest to said bottom edge of said carrier band whereby said lead wires do not extend to the bottom edge of said carrier band, each said lead wire having a substantially constant width throughout its length, and each said lead wire having a burr formed at the end thereof which burr engages said carrier band.

In brief, this invention is an electronic component series including a flexible carrier band, a plurality of the parallel lead type electronic components arranged on and distributed longitudinally of said carrier band, and an adhesive tape bonded to the carrier band with the lead wires of the electronic components held therebetween in a region closer to the end edge of the carrier band associated with the electronic components, the electronic component series being characterized in that the lead wires are cut off adjacent the end edge of the adhesive tape associated with the extremities of the lead wires and thus the extremities of the lead wires are removed.

The lead wires may be cut off by being punched round together with a carrier band. Also, the lead wires may be cut off by being punched together with a carrier band so that the carrier band may have slits.

Usually, holes for moving the electronic component series are formed in the carrier band. These holes may be formed in the middle of the width of the carrier band, or may be formed in the region closer to the direction of the width of the carrier band.

According to this invention, since the lead wires are cut off adjacent the end edge of the adhesive tape associated with the extremities of the lead wires, the unnecessary lead wire extensions can be recovered, so that the cost of the electronic component series can be effectively reduced. Further, the absence of the unnecessary extensions of the lead wires precludes trouble in moving the carrier band and the possibility of the attitude of the electronic components being upset and of the adhesive tape being peeled as otherwise might be caused by pending or entanglement of the extensions. Similarly, since burrs engaging with the carrier band are formed in the severed portions of the lead wire as a result of the cutting-off of the lead wires, the electronic components are retained more positively thus making it possible to prevent upsetting of the attitude of the electronic components more effectively.

Further, since the cutting-off of the lead wires is effected subsequently to the measurement of the electronic components or to taping, the production is easier, and moreover shipment can be secured after the characteristics of the electronic components have been confirmed.

These and other objects and features of this invention will become more apparent from the following detailed description to be given with reference to the drawings.

BRIEF DESCRIPTION OF THE DRAWINGS

FIG. 1 is a fragmentary plan view showing part of a conventional electronic component series;

FIG. 2 is a fragmentary plan view showing part of a first embodiment of this invention;

FIG. 3 is a fragmentary cross-sectional view showing part of the process for producing the embodiment shown in FIG. 2;

FIG. 3A is a fragmentary cross-sectional view showing part of the state after the lead wires are cut off in FIG. 3;

FIG. 4 is a fragmentary plan view showing part of a second embodiment of this invention;

FIG. 5 is a fragmentary cross-sectional view showing part of the process for producing the embodiment shown in FIG. 4;

FIG. 6 is a fragmentary plan view showing part of a third embodiment of this invention;

FIG. 7 is a fragmentary plan view showing part of a fourth embodiment of this invention.

DETAILED DESCRIPTION OF THE EMBODIMENTS

FIG. 2 is a fragmentary plan view showing a portion of a first embodiment of this invention, and FIG. 3 is a fragmentary cross-sectional view showing part of the process for producing the embodiment shown in FIG. 2. Referring to FIG. 2, an electronic component series 11 comprises, roughly, a carrier band 12, electronic components 13, and an adhesive tape 17. As in the conventional electronic series shown in FIG. 1, electronic components 13 are distributed longitudinally of a long-sized, carrier band 12 made, e.g., of thick paper, synthetic resin or metal and arranged thereon in the proper attitude for positioning in an automatic inserting machine. The electronic components 13 are of the parallel lead type, having lead wires 15 and 16 parallelly extending therefrom. An adhesive tape 17 is bonded to the carrier band 12 with the lead wires 15 and 16 held therebetween in a region closer to the side of the carrier band associated with the electronic component elements 14 than to the remaining side of the carrier band. The electronic components 13 are held in the proper attitude by the adhesive tape 17. Holes 18 are formed in the carrier band 12, arranged axially centrally thereof, said holes 18 being present for the purpose of engagement with a sprocket to feed the electronic component series 1 and for the purpose of accurate positioning in the automatic inserting machine.

In the feature of this embodiment, which is clearly shown in FIG. 2, the lead wires 15 and 16 are cut off adjacent the end edge 17a of the adhesive tape 17 associated with the extremities of the lead wires 15 and 16, and the extremities of the lead wires 15 an 16 are removed. That is, the electronic component series 11 in this embodiment is formed in such a manner that after the conventional electronic component series 1 shown in FIG. 1 has been completed, the lead wires are cut off adjacent the end edge of the adhesive tape associated with their extremities. The portions to be cut off are extensions 15a and 16a shown in phantom lines in FIG. 2, and the cutting-off process is shown in FIG. 3. Initially the electronic component series 11 with the extensions 15a and 16a which have yet to be cut off are placed on a support block 19. A cutting blade 20 is lowered in the direction of arrow X adjacent the end edge 17a of the adhesive tape 17 associated with the extremities of the lead wires 15 and 16, thereby cutting-off the lead wires 15 and 16, whereupon it is immediately retracted in the direction of arrow -X. Thus, the lead wires 15 and 16 are severed in this severing process. Since the cutting blade 20 is retracted in the direction of arrow -X immediately after cutting-off the lead wires 15 and 16, the carrier band 12 is not subjected to any significant damage. Therefore, there is no danger whatsoever of the strength of the electronic component series 11 being decreased. As is clear from FIG. 3b which is a fragmentary cross-sectional view showing the condition after cutting, the cutting-off of the lead wires 15 and 16 results in the formation of a burr 15b cutting into the carrier band 12 in the region where severance takes place. However, this burr 15b engages the carrier band 12 as it cuts into the latter, with the result that it serves to effectively prevent movement of the electronic component 13 in the direction of the length of the lead wires 15, 16 and of the carrier band 12, thereby achieving more stable retention. This cutting-off process is performed after measurements of the characteristics of the electronic series 13 have been made. Therefore, the measurement of the electronic component series 13 can be easily made by utilizing the portions 15a and 16a which will be later cut off.

Thus, in the embodiment described with reference to FIGS. 2 and 3, since the unnecessary extensions 15a and 16a are cut off adjacent the end edge 17a of the adhesive tape 17 associated with the extremities of the lead wires and are removed therefrom subsequently to taping by the adhesive tape 17 and to measurements of characteristics, the extensions 15a and 16a of the lead wires 15 and 16 can be recovered and hence the series can be produced at lower cost. Further, since the extensions 15a and 16a of the lead wires 15 and 16 are no longer present, there is no danger that the bending or entanglement of the lead wires 15 and 16 which might otherwise be caused in the automatic inserting machine will cause trouble in moving the electronic component series. Similarly, there is no danger of tilting or shifting the electronic components 13 which are fixed in the proper attitude for positioning, nor a danger of the adhesive tape 17 being peeled. Further, since the cutting-off and removal of the extension 15a and 16a of the lead wires 15 and 16 is performed subsequently to the taping of the electronic components 13, the positioning of the lead wires 15 and 16 of the electronic components 13 during taping can be easily achieved without any trouble, so that production can be performed highly efficiently and easily. Therefore, accurate insertion into print circuit boards becomes possible. Further, the cutting-off of the lead wires 15 and 16 which is characteristic of this embodiment is easily achieved by performing the positioning of the cutting blade 20 alone, and since it does not require the complicated alignment of blades as in the case of cutting by upper and lower blades, it can be implemented with extreme ease.

FIG. 4 is a fragmentary plan view showing part of a second embodiment of this invention, and FIG. 5 is a fragmentary cross-sectional view showing part of the process for producing the embodiment shown in FIG. 4. Referring to FIG. 4, the feature of the second embodiment lies in the fact that the cutting-off condition of the lead wires 15 and 16 differs from that in the first embodiment. The rest is the same as in the first embodiment, so that a description thereof will be omitted by giving the corresponding reference numerals to the corresponding parts. The front ends of the lead wires 15 and 16 are cut off by being punched by a round punch together with the carrier band 12. Referring to FIG. 5, the punch 21 is disposed above the electronic component series 11 having unsevered lead wires 15 and 16 and placed on a support block 19. The punch 21 is lowered in the direction of arrow X adjacent the end edge 17a of the adhesive tape 17 associated with the extremities of the lead wires, thereby punching the lead wires 15 and 16 together with the carrier band 12. Thereafter, it is retracted in the direction of arrow -X and the electronic component series 11 shown in FIG. 4 is thus produced. The portions of the lead wires 15 and 16 punched by the formation of round holes 22 and 23 can be recovered as well as the extensions 15a and 16a which have been cut off and removed. Therefore, the cost of the electronic component series 11 can be reduced as in the first embodiment. Further, since the extensions 15a and 16a of the lead wires are absent, it goes without saying that the same effects as in the first embodiment can be achieved. In performing the punching operation by the punch 21, it is only necessary to position the punch 21 adjacent the end edge 17a of the adhesive tape 17 above the lead wires 15 and 16, without requiring complicated blade alignment, so that the operation can be easily performed. In addition, in this embodiment since the cutting-off is effected by punching which extends even to the carrier band 12, there is no need to accurately adjust the switching point for the reciprocating movement of the punch 21.

FIG. 6 is a fragmentary plan view showing part of a third embodiment of this invention, corresponding to FIGS. 2 and 4. As is clear from FIG. 6, the feature of the third embodiment lies in the fact that the lead wires 15 and 16 are cut off so that slits 24 and 25 may be formed. That is, in the third embodiment, the cutting blade 20 shown in FIG. 3 not only cut off the lead wires 15 and 16 but also pierces through the carrier band 12, whereby it not only cuts off the lead wires 15 and 16 but also forms the slits 24 and 25 in the carrier band 12. Therefore, as in the second embodiment, the third embodiment has the advantage that there is no need for accurate adjustment of the retraction point for the reciprocating movement of the cutting blade 20. The rest is the same as in the first embodiment, so that a description thereof will be omitted by giving the corresponding reference numerals to the corresponding parts.

FIG. 7 is a fragmentary plan view showing a fourth embodiment of this invention. The feature of the fouth embodiment lies in the fact that the holes 18 are formed not in the middle of the width of the carrier band 12 but in a region closer to the end edge 12a of the carrier band 12 opposite to the electronic component elements 14. The rest is the same as in the first embodiment, so that a description thereof will be omitted by giving the corresponding reference numerals to the corresponding parts. Since the holes 18 are disposed closer to the end edge 12a, it is possible to narrow the width of the carrier band 12, as is clear from FIG. 7. That is, an electronic component series 11 can be formed by using a narrower carrier band 12 provided that it fits to the feed mechanism of the automatic inserting machine. This is because the portions which impart the necessary functions to the electronic component series 11 are no longer present except the holes 18 at the front of the end edge of the tape 17 associated with the extremities of the lead wires. Thus, the use of the narrower carrier band 12 makes it possible to further reduce the cost of the electronic component series 11.

In addition, in this invention, it is not always necessary for the extensions 15a and 16a of the lead wires 15 and 16 to project downwardly beyond the carrier band 12, but they may be present on the plane of the carrier band 12 in the form of free ends or with their ends connected together.

In practicing this invention, the holes 18 need not necessarily be formed such that they are spaced from the adhesive tape 17, and thus the holes, not shown, may be formed in the carrier band 12 and the adhesive tape 17 at a time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An electronic component series wherein a plurality of electronic components are securely and stably secured to a carrier band such that the leads of said components are not unduly exposed in a manner which would permit them to be accidently moved out of their desired orientation, said component series, comprising:
   an elongated, flexible carrier band having a top and a bottom edge;
   a plurality of electronic components of the parallel lead type each having lead wires and an electronic element connected to said lead wires, said electronic component being arranged on and distributed longitudinally of said carrier band with said electronic component extending above said top edge of said carrier band and said lead wires overlapping a portion of said carrier band; and
   an elongated adhesive tape having a transverse width which is less than the transverse width of said carrier band, said tape being bonded to said carrier band with said lead wires of said electronic components held therebetween in a region closer to said top edge of said carrier band than said bottom edge of said carrier band;
   each of said lead wires having an end portion which terminates at a location substantially immediately adjacent that end of said adhesive tape which is closest to said bottom edge of said carrier band whereby said lead wires do not extend to said bottom edge of said carrier band, each said lead wire having a substantially constant width throughout its length and each said lead wire having a burr formed at the end thereof, which burr engages said carrier band.

2. An electronic component series in accordance with claim 1, wherin a respective round hole is formed in said carrier band adjacent said end portion of each said lead wire.

3. An electronic component series in accordance with claim 1, wherein a respective slit is formed in said carrier band adjacent said edge portion of each of said lead wires.

4. An electronic component series in accordance with any one of claims 2 or 3, wherein holes for moving the electronic component series are formed in the carrier band.

* * * * *